(12) United States Patent
Yokoi et al.

(10) Patent No.: US 7,381,073 B2
(45) Date of Patent: *Jun. 3, 2008

(54) RADIOLOGICAL IMAGING APPARATUS

(75) Inventors: Kazuma Yokoi, Hitachi (JP); Hiroshi Kitaguchi, Naka (JP); Takafumi Ishitsu, Hitachi (JP); Naoyuki Yamada, Hitachinaka (JP); Kensuke Amemiya, Hitachinaka (JP); Yuuichirou Ueno, Hitachi (JP); Katsutoshi Tsuchiya, Hitachi (JP); Norihito Yanagita, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/626,703

(22) Filed: Jan. 24, 2007

(65) Prior Publication Data

US 2007/0117439 A1    May 24, 2007

Related U.S. Application Data

(63) Continuation of application No. 11/257,127, filed on Oct. 25, 2005, now Pat. No. 7,183,557.

(30) Foreign Application Priority Data

Oct. 25, 2004  (JP)  .............................. 2004-310003

(51) Int. Cl.
*H01R 11/22*  (2006.01)
*G01T 1/24*  (2006.01)
(52) U.S. Cl. .................................. 439/267; 250/370.09
(58) Field of Classification Search ................ 439/267, 439/347, 327, 259–260; 250/370.09
See application file for complete search history.

(56) References Cited

U.S. PATENT DOCUMENTS 4,210,805 A   7/1980 Kobayashi et al.
4,402,563 A *  9/1983 Sinclair ....................... 439/264

(Continued)

FOREIGN PATENT DOCUMENTS

JP         57163967         10/1982

(Continued)

OTHER PUBLICATIONS

"Third Edition of Radiation Measurement Handbook" Nikkan Kogyo Shimbun Ltd., p. 559, no date.

*Primary Examiner*—Truc T. Nguyen
*Assistant Examiner*—X. Chung-Trans
(74) *Attorney, Agent, or Firm*—Dickstein Shapiro LLP

(57) ABSTRACT

A radiological imaging apparatus allowing semiconductor radiation detectors to be easily replaced with new ones and densely arranged. Terminals ($31c_{jk}$) and ($33c_{jk}$) are provided on a bottom surface of a detector aggregate ($40_{mn}$) including a plurality of semiconductor radiation detectors (1); the terminals is connected to electrodes (3 and 4) of the detectors (1). A plurality of zero insertion force connectors (56) are provided on a connecting device ($33_{jk}$) installed on a support substrate ($32_h$). The terminals ($31c_{jk}$ and $33c_{jk}$) are detachably attached to the zero insertion force connectors (56) to mount the detector aggregates ($40_{mn}$) that are the semiconductor radiation detectors (1), on the support substrate ($32_h$). When the detector aggregates ($40_{mn}$) are attached to the zero insertion force connectors (56), since no frictional force acts on the terminals, the size of the gap between the detector aggregates ($40_{mn}$) is reduced.

26 Claims, 9 Drawing Sheets

U.S. PATENT DOCUMENTS

| | | |
|---|---|---|
| 4,575,171 A | 3/1986 | Igarashi et al. |
| 4,744,768 A * | 5/1988 | Rios ............................ 439/262 |
| 5,387,121 A * | 2/1995 | Kurz ............................ 439/342 |
| 6,236,051 B1 | 5/2001 | Yamakawa et al. |
| 6,618,942 B2 | 9/2003 | Beaman et al. |
| 7,029,302 B2 * | 4/2006 | Sawaya ........................ 439/260 |
| 7,183,557 B2 * | 2/2007 | Yokoi et al. ............ 250/370.09 |

FOREIGN PATENT DOCUMENTS

| | | |
|---|---|---|
| JP | 6071090 U | 5/1985 |
| JP | U 63-83779 | 6/1998 |
| JP | 11126890 A | 5/1999 |
| JP | 11281747 | 10/1999 |
| JP | 11304930 | 11/1999 |
| JP | 20000206257 | 7/2000 |
| JP | 2002110273 A | 4/2002 |
| JP | 2003187928 A | 7/2003 |

* cited by examiner

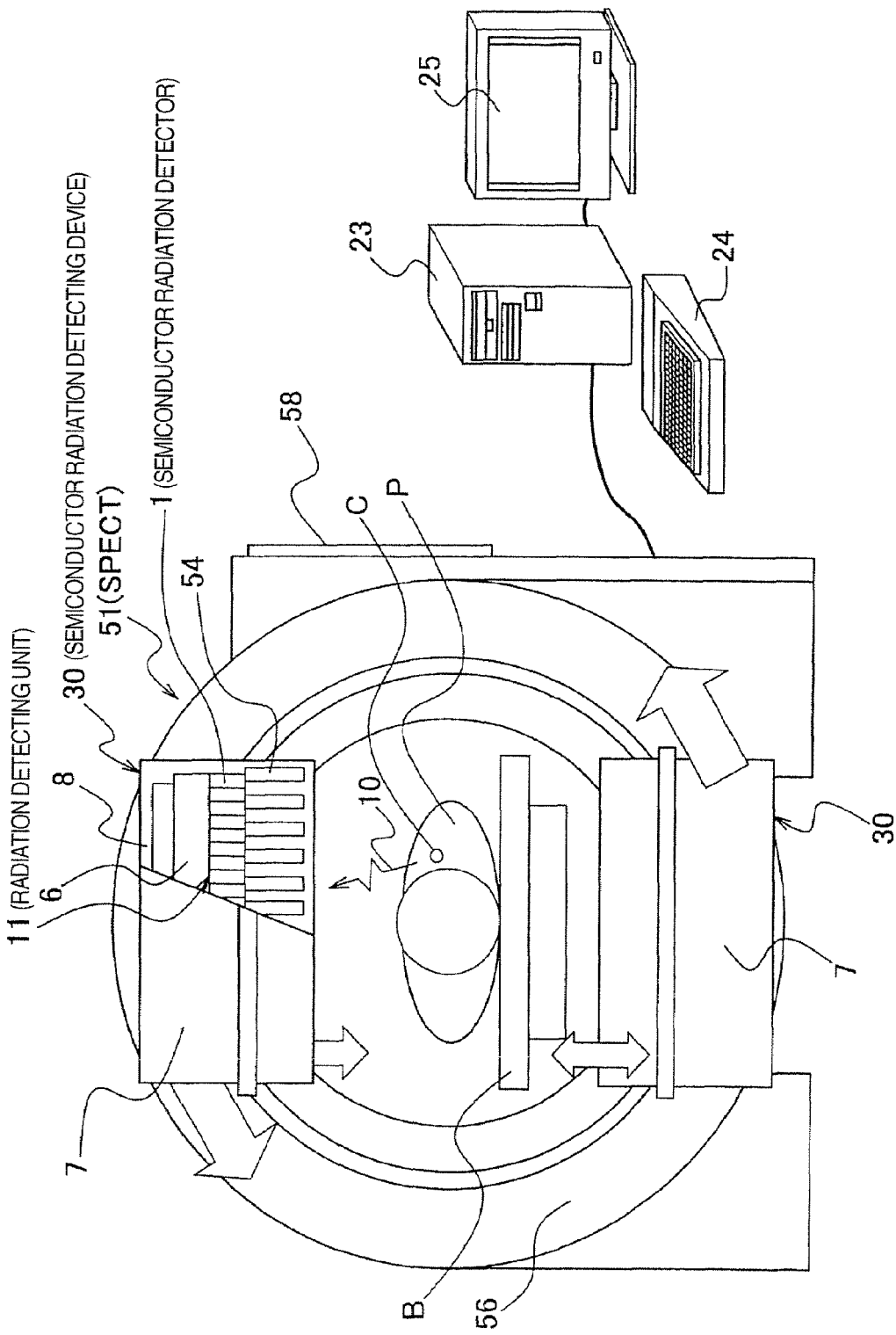

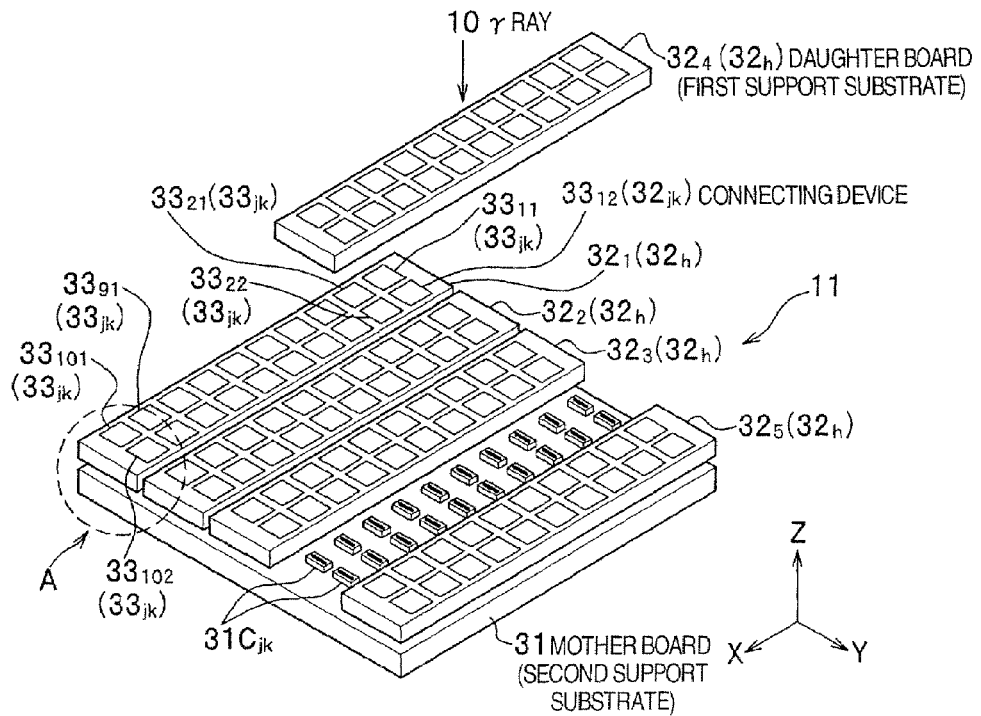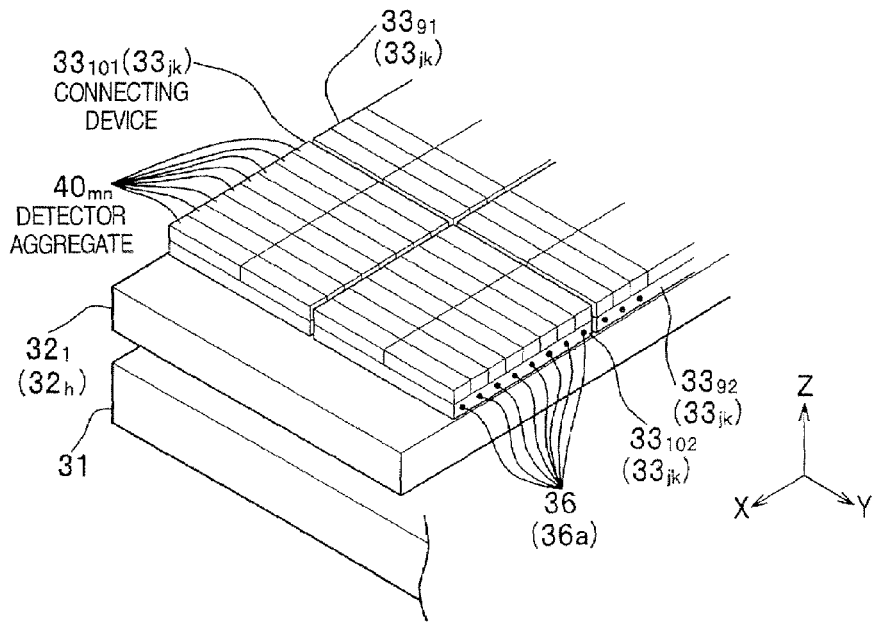

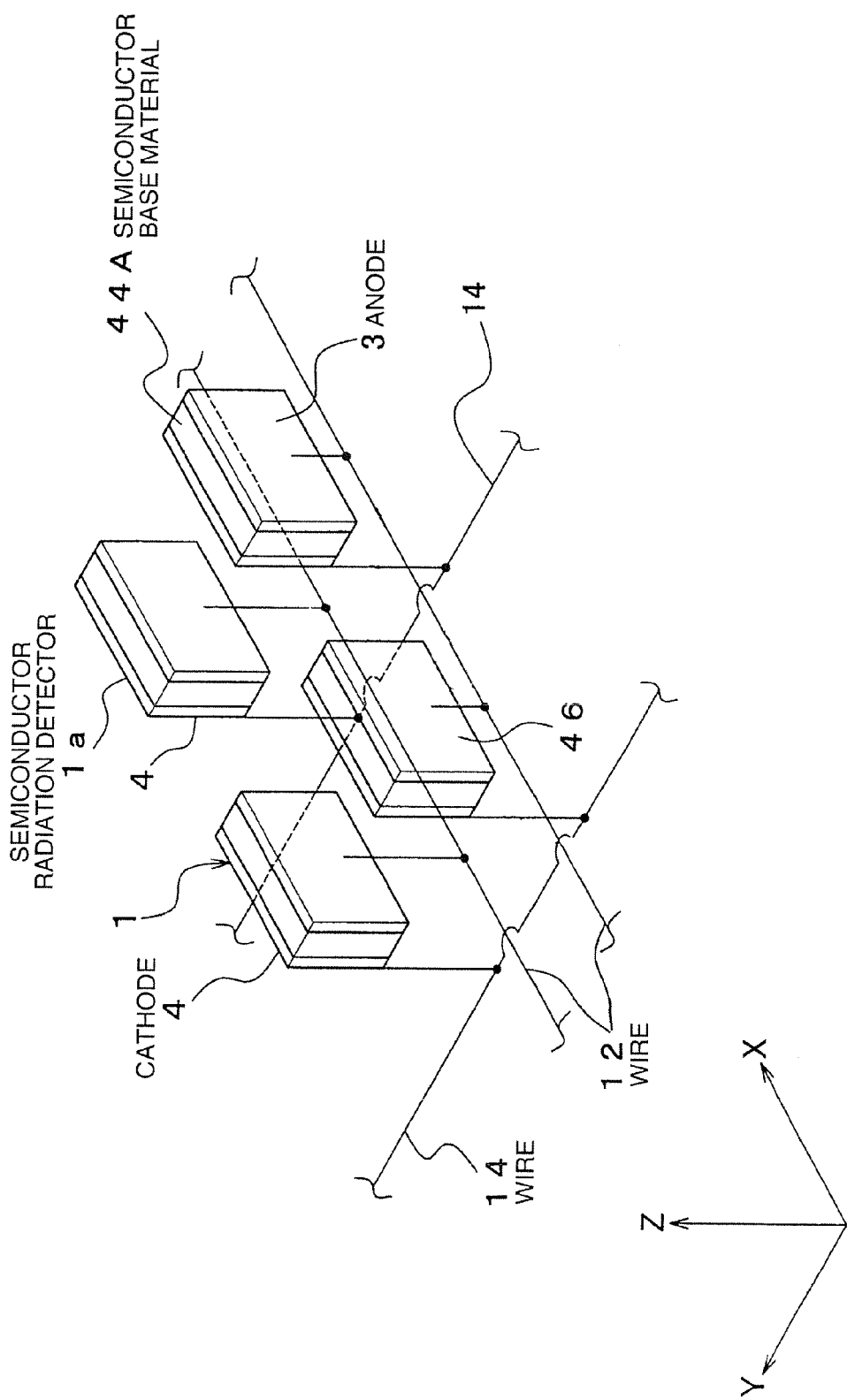

RADIOLOGICAL IMAGING APPARATUS

CROSS-REFERENCE TO RELATED APPLICATIONS

This application is a continuation of U.S. patent application No. 11/257,127, filed on Oct. 25, 2005 now U.S. Pat. No. 7,183,557, the subject matter of which is incorporated in its entirety by reference herein.

BACKGROUND OF THE INVENTION

The present invention relates to a radiological imaging apparatus, and in particular, to a radiological imaging apparatus using a semiconductor radiation detector.

In the prior art, a semiconductor radiation detector is electrically connected to wiring placed inside a support substrate using a method such as soldering, while being mechanically held on the support substrate (Third Edition of Radiation Measurement Handbook (NIKKAN KOGYO SHIMBUN LTD.), p.559).

Conventionally, an operation of replacing a semiconductor radiation detector is not easy because of the need for a soldering process. On the other hand, the semiconductor radiation detector may use a connector that requires an insertion force to push a male terminal provided on the detector, in a spring of a female terminal. The female terminal is provided in the connector. Even a low insertion connector (LIF) requires a force of about several grams/pin to push the semiconductor radiation detector. The inventors have found that when the semiconductor radiation detector is pushed in the connector requiring an insertion force, a load on the semiconductor radiation detector exerts a strong frictional force between the male terminal on the semiconductor radiation detector and the spring of the female terminal, making the semiconductor radiation detector likely to incline. The inventors have also found that the inclining semiconductor radiation detector may slidably contact and damage a delicate semiconductor member of an adjacent semiconductor radiation detector. This problem may also occur when the semiconductor radiation detector is pulled out of its connector for replacement; also in this case, the adjacent semiconductor radiation detector may be damaged. This problem can be avoided by increasing the clearance between the semiconductor radiation detectors installed on the support substrate to the extent that the semiconductor member is not damaged by the contact. However, the formation of such a clearance causes the semiconductor radiation detectors to be more densely arranged. This prevents the further improvement of sensitivity and spatial resolution of the semiconductor radiation detector.

SUMMARY OF THE INVENTION

It is an object of the present invention to provide a radiological imaging apparatus that enables semiconductor radiation detectors to be more densely arranged.

To accomplish this object, the present invention is characterized that a plurality of semiconductor radiation detectors are detachably attached to a plurality of non-insertion connectors provided on a support substrate, a first electrode of each of the semiconductor radiation detectors is connected to a first wire provided in the support substrate via the corresponding zero insertion force connector, and a second electrode of the semiconductor radiation detector is connected to a second wire provided in the support substrate via the zero insertion force connector.

The semiconductor radiation detector is thus detachably attached to the zero insertion force connector. This substantially eliminates the need for a force for pushing the semiconductor radiation detector in the zero insertion force connector when the semiconductor radiation detector is inserted into the connector. This in turn reduces the degree of damage done to the semiconductor radiation detector by the semiconductor member of the adjacent one when the latter is inserted into the zero insertion force connector, even with a reduced clearance between the semiconductor radiation detectors. Therefore, it is possible to reduce the clearance between the semiconductor radiation detectors and to enable the semiconductor radiation detectors to be more densely arranged using the support substrate. The more dense arrangement of the semiconductor radiation detectors makes it possible to further improve the sensitivity and spatial resolution of each semiconductor radiation detector. The improvement of the detector sensitivity further reduces the time required for checks. Further, the application of the zero insertion force connectors allows the semiconductor radiation detector to be easily replaced with a new one.

Preferably, the first and second wires arranged in the support substrate have a matrix structure. This reduces the number of wires and the size of an area required to install the wires. This in turn increases the size of a free space in the support substrate in which the wires can be installed, thus contributing to increasing the density of arrangement of semiconductor radiation detectors. Further, the matrix structure of the wires enables a sharp reduction in the number of measuring circuits. This contributes to reducing the size of a detector head.

The present invention enables semiconductor radiation detectors to be more densely arranged while allowing each of the semiconductor radiation detectors to be replaced with a new one.

Other objects, features and advantages of the invention will become apparent from the following description of the embodiments of the invention taken in conjunction with the accompanying drawings.

BRIEF DESCRIPTION OF THE DRAWINGS

FIG. 1 is a diagram showing the whole SPECT apparatus in accordance with a first embodiment of the present invention;

FIG. 2A is a detailed perspective view of a radiation detecting unit shown in FIG. 1, and FIG. 2B is a partly enlarged perspective view showing that part of the radiation detecting unit shown in FIG. 2A which is shown by arrow A;

FIGS. 8A-8D are an enlarged sectional view of the internal configuration of the connecting device shown in FIGS. 2A and 2B, wherein FIG. 8A is an enlarged perspective view of a rotative movement member, FIG. 8B is an enlarged sectional view of that part of the connecting device shown in FIG. 7B which is shown by arrow D, the figure showing that holding of a detector is cancelled, FIG. 8C is an enlarged sectional view of a part of FIG. 7B shown by arrow E, the figure showing that the detector is held, and FIG. 8D is a view of a cross section passing through a notch; and FIG. 9 is a conceptual drawing illustrating a wire matrix structure.

DESCRIPTION OF THE INVENTION

Figure 3:
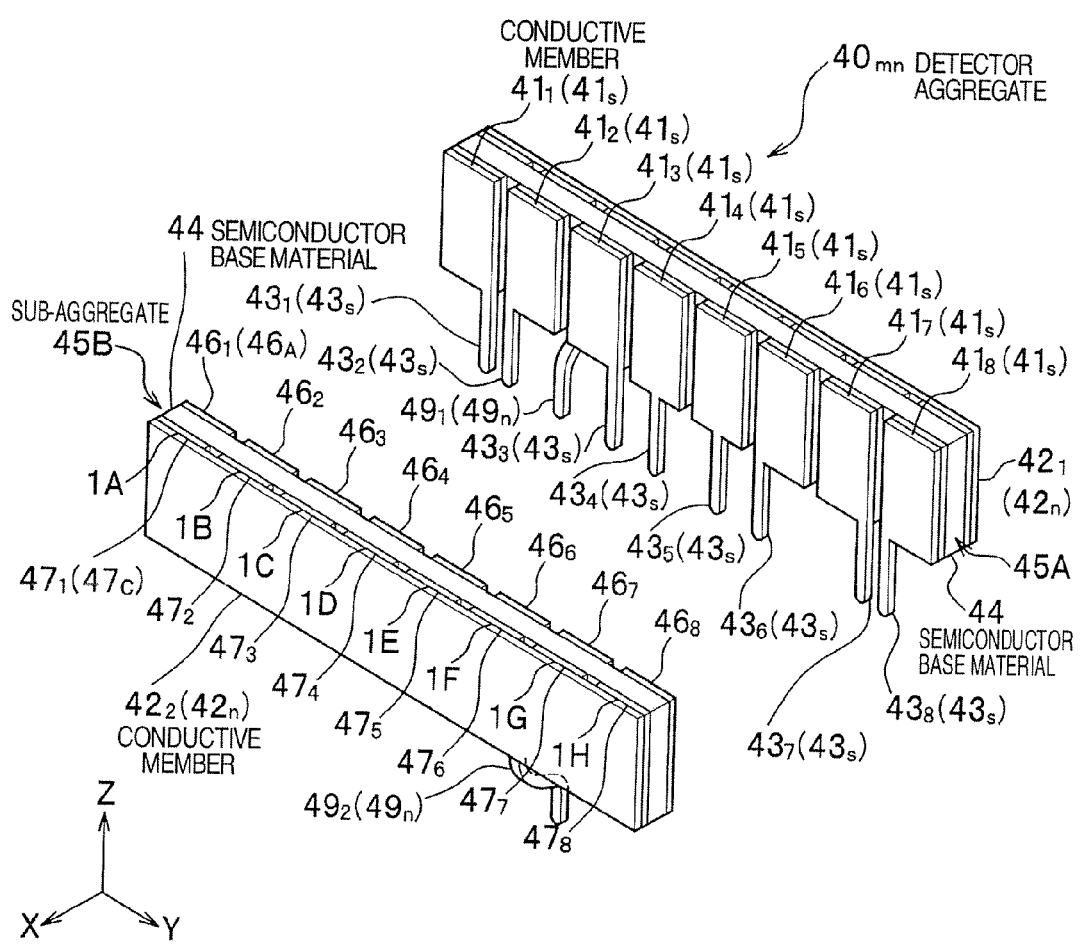
FIG. 3 is an exploded perspective view of a detector aggregate shown in FIG. 2B.

Embodiments of the present invention will be described below with reference to FIGS. 1 and 8A to 8D.

With reference to FIG. 1, description will be given of a single photon emission computer tomography apparatus (referred to as a SPECT apparatus below) that is an example of a semiconductor radiological imaging apparatus in accordance with an embodiment of the present invention. The SPECT apparatus 51 comprises a bed B that supports a patient P that is a subject, a pair of semiconductor radiation detecting devices (detector heads) 30, a rotating support 56, a data collecting and analyzing device 23, a data input device 24, and a display device 25. The semiconductor radiation detecting devices 30 are installed on the rotating support 56 so as to be offset from each other by 180° in a circumferential direction. The semiconductor radiation detecting devices 30 project from the rotating support 56 in a longitudinal direction of the bed B. The bed B is inserted between the two opposite semiconductor radiation detecting device 30. Each of the semiconductor radiation detecting devices 30 comprises a support member 6, a measuring circuit unit 8, a radiation detector unit 11, and a collimator 54 which are installed on the rotating support 56. The support member 6 is mounted on the rotating support 56 so as to be movable in a radial direction of the rotating support 56. The measuring circuit unit 8, radiation detector unit 11, and collimator 54 are mounted on the support member 6. Each radiation detector unit 11 faces toward the bed B. The collimator 54 is placed between the radiation detector unit 11 and the bed B to limit the view angles from semiconductor radiation detectors (referred to as detectors below) 1 of the radiation detecting unit 11. The radiation detecting unit 11, collimator 54, and measuring circuit unit 8 are housed in a light blocking electromagnetic shield 7 attached to the support member 6. The light blocking electromagnetic shield 7 blocks radiations emitted by an affected part C, that is, electromagnetic waves different from a γ ray 10. The light blocking electromagnetic shield 7 thus prevents the electromagnetic waves from affecting the radiation detecting unit 11 and the measuring circuit unit 8. Instead of the pair, three semiconductor radiation detecting devices 30 may be provided.

The bed B is moved on which the patient P to which a radioactive agent has been administered lies. The patient P is thus moved to between the pair of semiconductor radiation detecting devices 30. The γ ray 10 is emitted from the affected part C in the patient P in which the radioactive agent has been collected. The ray 10 is then incident on each of the detector 1 of the radiation detecting unit 11 through a through-hole portion in the collimator 54. The detector 1 outputs a γ ray detection signal (analog signal) to the measuring circuit unit 8, which then processes the signal. The data collecting and analyzing device 23 uses information output by the measuring circuit unit 8 to create a tomography information on the patient P. The data collecting and analyzing device 23 then displays the tomography information on the display device 25. The rotating support 56 is rotated to pivot the semiconductor radiation detecting device 30, including the radiation detecting unit 11, around the patient P. With the semiconductor radiation detecting device 30 pivoting, each detector 1 detects the γ ray 10 to output the γ ray detection signal. The following operations can be performed near the SPECT apparatus 51 using an operation panel 58: control of rotation of the rotating support 56, control of the distance between the radiation detecting unit 11 and the patient P, and control of position of the patient P using the bed. These operations can also be remotely performed using a data input device 24.

Now, with reference to FIGS. 2A and 2B, description will be given of the radiation detecting unit 11 used in the present embodiment.

The radiation detecting unit 11 comprises one mother board 31 that is a second support substrate, a plurality of (in the figure, five) daughter boards $32_h(32_1, 32_2, \ldots)$ placed on the surface of the second support substrate that are first support substrates, and a plurality of detector aggregates $40_{mn}$ that are detachably attached on each of the daughter boards $32_h$ (see FIGS. 2B and 3). The width of the daughter board $32_h$ is determined by the number of connecting devices $33_{jk}$ that can be opened and closed by one rotation operating member (operation member) 36 as described later. If the semiconductor radiation detecting device 30 can be entirely operated from end to end using the single rotation operating member 36, the connecting device $33_{jk}$ can be mounted directly on the mother board 31 without using the daughter board $32_h$.

The daughter board $32_h$ has the detector aggregate $40_{mn}$ (see FIGS. 2B and 3) provided on its surface to detect the γ ray 10; a longitudinal direction of the detector aggregate $40_{mn}$ is aligned with the direction (across the Y axis in the figure) in which the radiation detecting unit 11 is rotatively moved. The longitudinal direction of the detector aggregate $40_{mn}$ is aligned with the rotatively moving direction of the radiation detecting unit 11 because this makes it possible to avoid the effect (vibration or the like) of an inertia force on the detector aggregate $40_{mn}$ which is exerted as the rotation of the radiation detecting unit 11 is accelerated or decelerated, thus preventing electrodes from being bent. The daughter board $32_h$ puts together faint analog signals provided by the detector aggregate $40_{mn}$ upon detecting the γ ray 10. The daughter board $32_h$ then outputs the resulting signal to the mother board 31. The detector aggregate $40_{mn}$ is detachably mounted on the connecting device $33_{jk}$, provided on a surface of the daughter board $32_h$, as described later. As described later in detail, the detector aggregate $40_{mn}$ is attached and removed by rotatively moving a head 36a of the rotation operating member 36, exposed at an end of the daughter board $32_h$.

Thus, in FIGS. 2A and 2B, five daughter boards 32h (h=1 to 5) are provided on one mother board 31, and 2×10, that is, 20 connecting devices $33_{jk}$ (j=1 to 10, k=1 or 2) are provided on the daughter board $32_h$, and 16 (8×2) detector aggregates $40_{mn}$ (m=1 to 8, n=1 or 2) are provided on the connecting device $33_{jk}$. One detector aggregate $40_{mn}$ has 16 detectors 1 as shown in FIG. 3, described below. One detector constitutes one pixel range. The numbers of components arranged shown above are only illustrative and may be increased or reduced depending on the purpose.

The detector aggregate $40_{mn}$ will be specifically described with reference to FIGS. 3 and 4A to 4C.

The detector aggregate $40_{mn}$ has two sub-aggregates 45A and 45B, conductive members (first conductive members) $41_s$ ($41_1$, $41_2$, $41_3$, $41_4$, $41_5$, $41_6$, $41_7$, and $41_8$) (S=1 to 8), and conductive members (second conductive members) $42_n$ ($42_1$, and $42_2$). Each of the sub-aggregates 45A and 45B has a plurality of anodes $46_A$ (A=1 to 8) separately provided on one surface of a semiconductor base material (semiconductor member) 44 at predetermined intervals. Each of the sub-aggregates 45A and 45B has a plurality of cathodes $47c$ (c=1 to 8) separately provided on the other surface of the semiconductor base material 44 at predetermined intervals. The anodes $46_A$ and the cathodes $47c$ are formed by depositing a conductive metal on the surface of the semiconductor base material 44. The semiconductor base material 44 is composed of cadmium telluride (CdTe) or the like, which generates charges when the γ ray 10 is incident on the semiconductor base material 44. The semiconductor base material 44 has a planar shape, and its longitudinal direction corresponds to the direction of the Y axis in the figure. Each of the anodes $46_A$ lies opposite the corresponding cathode $47c$ across the semiconductor base material 44. One detector 1 is composed of one anode $46_A$, the cathode $47c$ lying opposite this anode $46_A$, and a part of the semiconductor base material 44, located between the anode $46_A$ and the cathode $47c$. Each of the sub-aggregates 45A and 45B has substantially eight detectors 1, specifically, detectors 1A, 1B, 1C, 1D, 1E, 1F, 1G, and 1H. Each of the anodes $46_A$ in the sub-aggregate 45A lies opposite the corresponding anode $46_A$ in the sub-aggregate 45B. The plurality of conductive members $41_s$, ($41_1$, $41_2$, $41_3$, $41_4$, $41_5$, $41_6$, $41_7$, and $41_8$) are attached to each of eight anodes $46_A$ in the sub-aggregate 45A using a conductive adhesive and also attached to each of eight anodes $46_A$ in the sub-aggregate 45B using a conductive adhesive. Thus, the conductive member $41_s$, is located between the anode $46_A$ in the sub-aggregate 45A and the anode $46_A$ in the sub-aggregate 45B. The two conductive members $42_n$ ($42_1$, and $42_2$) are attached separately to the eight cathodes $47c$ in the sub-aggregate 45B and to the eight cathodes $47c$ in the sub-aggregate 45B using a conductive adhesive. The conductive members $41_s$, and $42_n$, are composed of plates of conductive metal (for example, copper).

The detector aggregate $40_{mn}$ is thus configured, so that one detector forms one pixel. That is, one detector aggregate $40_{mn}$ provides 16 pixels.

Figure 4A:
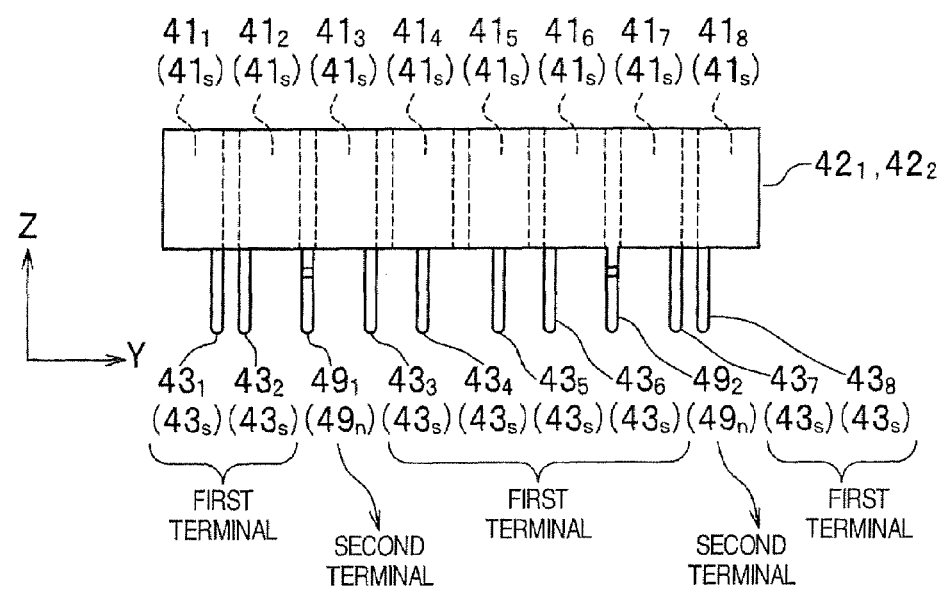
FIG. 4A is a front view of the detector aggregate.
Figure 4B:
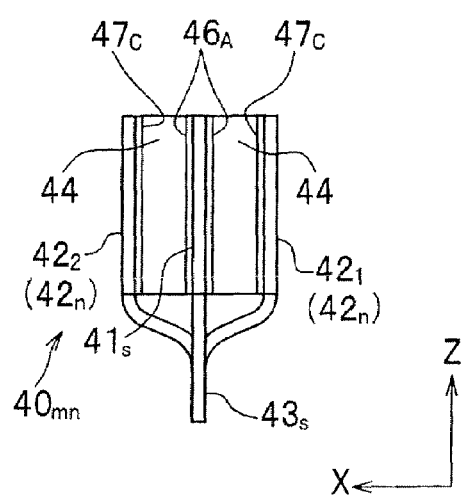
FIG. 4B is a side view of the detector aggregate.

As shown in FIGS. 3 and 4A, first terminals $43_s$, ($43_1$, $43_2$, $43_3$, $43_4$, $43_5$, $43_6$, $43_7$, and $43_8$) (s=1 to 8) project from the semiconductor base material 44 and extend from an end surface of the respective conductive members $41_s$ along a Z axis. Second terminals $49_1$ and $49_2$ are similarly provided on an end surface of the conductive member $42_n$ ($42_1$ and $42_2$) Moreover, the second terminals $49_n$ ($49_1$ and $49_2$) have their roots folded so that their tips coincide with the arrangement of the first terminals $43_s$, ... of one detector aggregate $40_{mn}$. Further, a large potential difference of several hundred V is present between the first terminals $43_1$, ... and the second terminal $49_1$ or $49_2$ in order to collect charges. Accordingly, the roots of the conductive members $42_1$ and $42_2$ are folded so as to create a gap between the conductive member and the semiconductor base material 44 of the detector aggregate $40_{mn}$ to maintain electric insulation. As shown in FIG. 4B, all the first terminals $43_s$ and second terminals $49_n$ appear to be superimposed on one another as viewed from the side of the detector aggregate $40_{mn}$.

The second terminal $49_1$ and the first terminals $43_2$ and $43_3$ ($43_6$ and $43_7$) have different poles. Accordingly, the second terminal $49_1$ is separated from the first terminals $43_2$ and $43_3$ ($43_6$ and $43_7$), arranged adjacent to the second terminal $49_1$ as shown in FIG. 4A, in order to prevent sparks, increase insulation lifetime, and reduce a leakage current. This is to apply high voltages to these electrodes so that positive and negative charges generated by the semiconductor base material 44 upon detecting a radiation can migrate efficiently to the corresponding electrodes (anode $46_A$ and cathode $47c$). The first terminals $43_1$ and $43_8$, which are located at the opposite ends of the detector aggregate $40_{mn}$, are arranged so as to reduce the spacing between themselves so that a terminal insertion hole $34_{mn}$ has a reduced opening area.

Figure 4C:
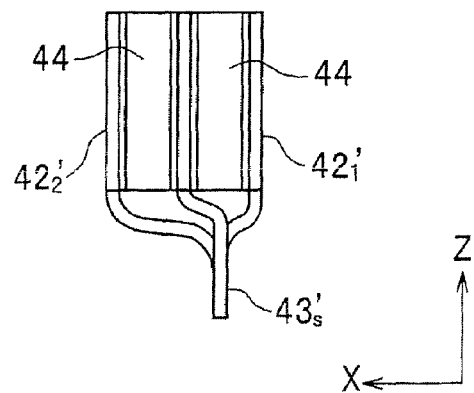
FIG. 4C is a side view of another embodiment of the detector aggregate.

FIG. 4C is a side view showing another embodiment of the detector aggregate $40_{mn}$. A terminal $43s'$ is provided closer to the conductive member $42'_1$ or $42'_2$. This arrangement enables a detector holding member 38 shown in FIGS. 8A-8D, particularly the rotation operating member 36, to be located immediately below the detector aggregate $40_{mn}$. This clarifies the positional relationship between the exposed part of the head 36a of the rotation operating member 36, shown in FIGS. 8A-8D, and the corresponding detector aggregate $40_{mn}$.

Figure 5A:
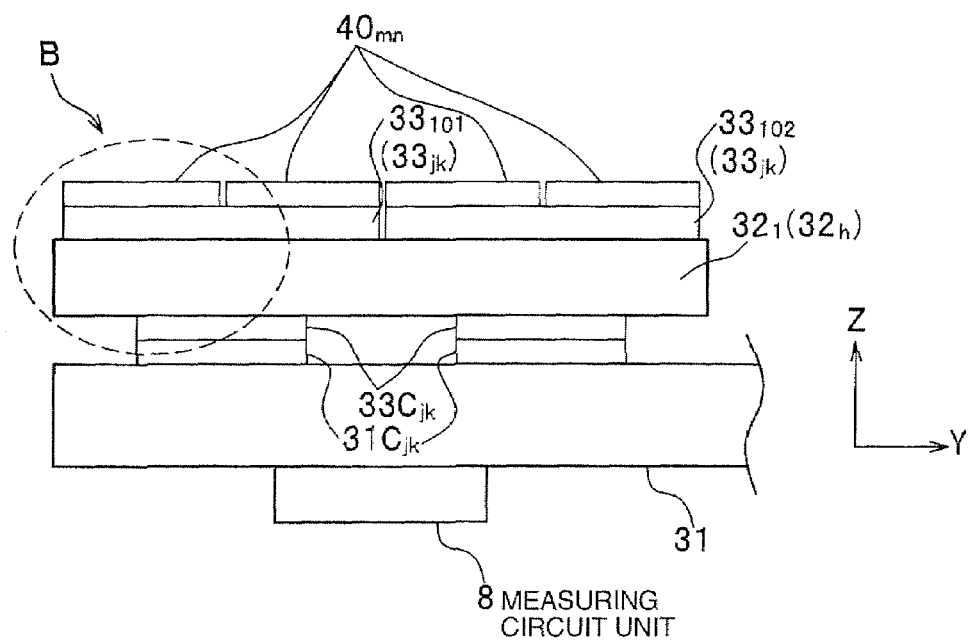
FIG. 5A is a front view of the radiation detecting unit shown in FIG. 2B as viewed from the direction of an X axis in the figure.
Figure 5B:
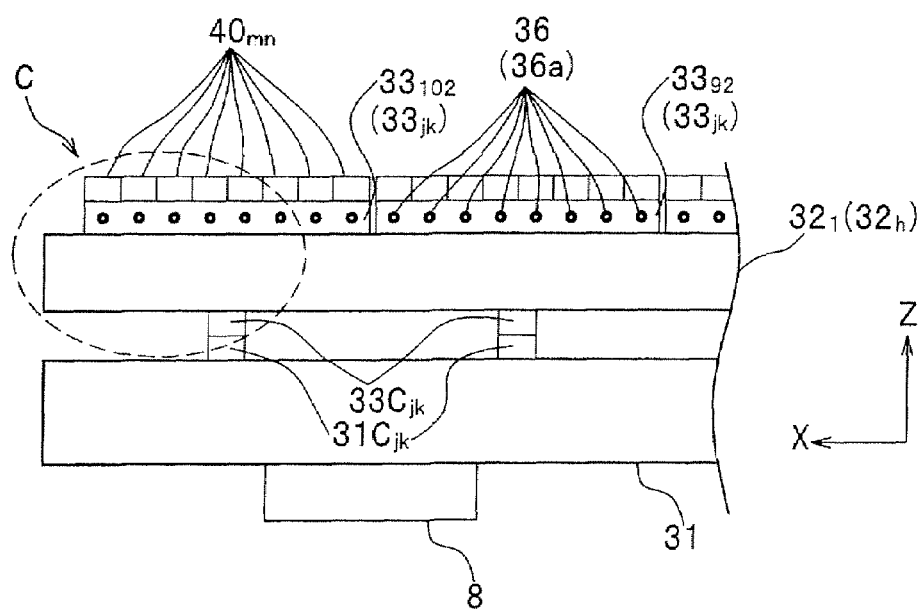
FIG. 5B is a side view of the radiation detecting unit as viewed from the direction of a Y axis.

As shown in FIGS. 5A and 5B, output terminals $33c_{jk}$ are provided on a surface of the daughter board $32_h$ which is opposite the one on which the detector aggregate $40_{mn}$ is placed; the output terminals $33c_{jk}$ transmit a detected γ ray detection signal. The output terminals $33c_{jk}$ are provided on a back surface of the daughter board $32_h$ in association with each connecting device $33_{jk}$.

Input terminals $31c_{jk}$ are provided on a front surface of the mother board 31; the input terminals $31c_{jk}$ are connected to the output terminals $33c_{jk}$, and γ ray detection signals are input through the input terminals $31c_{jk}$. The measuring circuit unit 8 (also see FIG. 1), provided on the back surface of the mother board 31 (which is opposite that surface on which the input terminals $31c_{jk}$ are provided), has a function for converting the input γ ray detection signals into a digital signal and outputting the processed signals to the data collecting and analyzing device 23 (see FIG. 1).

The measuring circuit unit 8 is a custom ASIC (Application Specific Integrated Circuit) designed and manufactured on the basis of system specifications. The measuring circuit unit 8 is further divided into a measuring processing circuit and a control processing circuit. The measuring processing circuit first amplifies each of the input γ ray detection signal and measures a pulse height value. Then, the control processing circuit forms a digital signal by adding, to the pulse height value, a value (trigger information) measured when the γ ray detection signal is input and address information on the detector 1 (see FIG. 3) having provided the γ ray detection signal. The digital signal is then input to the data collecting and analyzing device 23. The address information on the detector 1 is obtained by identifying an X axis wire $96_s$ and a Y axis signal read line $97_n$, (see FIGS. 7A and 7B) through which the γ ray detection signal has been transmitted.

Figure 6:
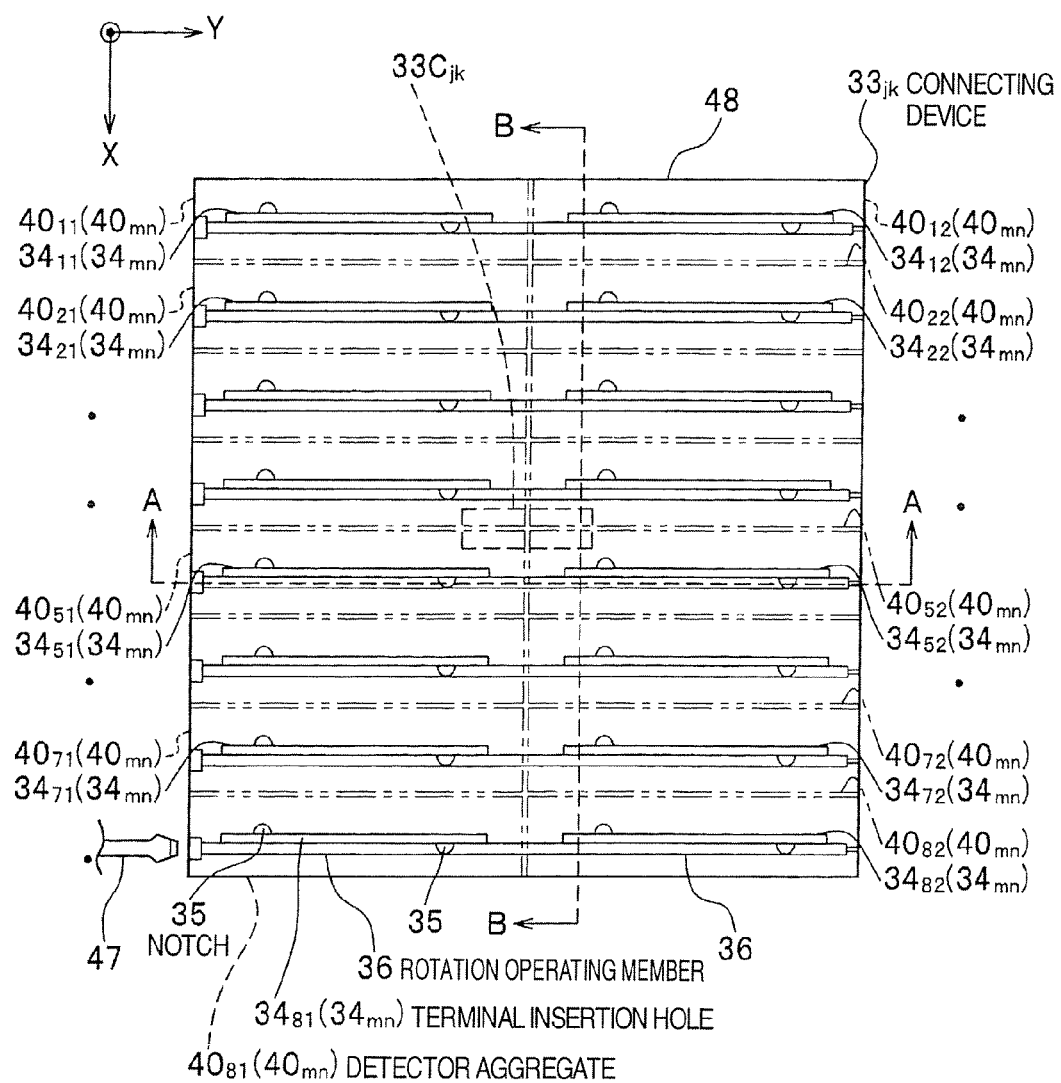
FIG. 6 is a top view of a connecting device shown in FIGS. 2A and 2B.

The connecting device $33_{jk}$ will be described with reference to FIGS. 7A and 7B and 8A to 8D. In FIG. 6, the contours of the (in the figures, 8×2=16) detector aggregates $40_{mn}$ mounted on the connecting device $33_{jk}$ are shown by alternate long and two short dashes lines so that the arrangement of the detector aggregates $40_{mn}$ can be understood. The connecting device $33_{jk}$ has a plurality of zero insertion force connectors 52. As many zero insertion force connectors 52 as the detector aggregates $40_{mn}$ are arranged in parallel in a housing 48 of the connecting device $33_{jk}$; the detector aggregates $40_{mn}$ are mounted on the connecting device $33_{jk}$ in the direction of the X axis. Each of the zero force insertion connectors 52 has a pressure contact member $37_s$ and a contact member $39_s$, a pressure contact member $27_n$ and a contact member $29_n$, and one rotation operating member 36. There are 16 pressure contact members $37_s$ and contact members $39_s$, and 4 pressure contact members $27_n$ and 4 contact members $39_n$. The paired pressure contact member $37_s$ and contact member $39_s$ and the paired pressure contact member $27_n$ and contact member $29_n$ are installed in a bottom portion of the housing 48 (see FIGS. 7B and 8B). The paired pressure contact member $37_s$ and contact member $39_s$ lie opposite each other and the paired pressure contact member $27_n$ and contact member $29_n$ lie opposite each other. As many pairs of the pressure contact member $37_s$ and contact member $39_s$ as first terminals $43_s$ are provided; the first terminals $43_s$ are provided in the two detector aggregates $40_{mn}$ arranged in series in the direction of the Y axis. As many pairs of the pressure contact member $27_n$ and contact member $29_n$ as second terminals $49_n$ are provided; the second terminals $49_n$ are provided in the two detector aggregates $40_{mn}$ arranged in series in the direction of the Y axis. The paired contact members are arranged in a line along the longitudinal direction of the rotation operating member 36. The rotation operating member 36 is placed so as to extend in the direction of the Y axis. The opposite ends of the rotation operating member 36 are held by respective side walls (operation member support sections) of the housing 48. The operation member support sections support a detector support member 50 described later. One rotation operating member 36 is provided for the two detector aggregates $40_{mn}$ arranged in series and is placed beside the pressure contact member $^{37}$. The pressure contact members $37_s$ and $27_n$ are composed of leaf springs.

The housing 48 has a plurality of terminal insertion holes $34_{mn}$ formed inside and having openings in their front surfaces. The housing 48 has the detector support member 50 at its upper end in which the opening is formed and which supports a bottom surface of each detector aggregate $40_{mn}$. The first terminal $43_s$ and second terminal $49_n$ (see FIGS. 3 and 4A) of each detector aggregate $40_{mn}$ are inserted into the opening in the detector support member 50. Each detector aggregate $40_{mn}$ is held by the detector support member 50 in the connecting device $33_{jk}$. Two notches 35 formed in the opening of the terminal insertion hole $34_{mn}$ avoid contacting the roots of the above-described second terminals $49_1$ and $49_2$ (see FIGS. 4A to 4C) with the detector support member 50. The notches 35 also position the held detector aggregate $40_{mn}$.

The detector aggregate $40_{mn}$ may have its surface provided with a thin insulating coating in order to prevent contact with another detector aggregate $40_{mn}$.

Figure 7A:
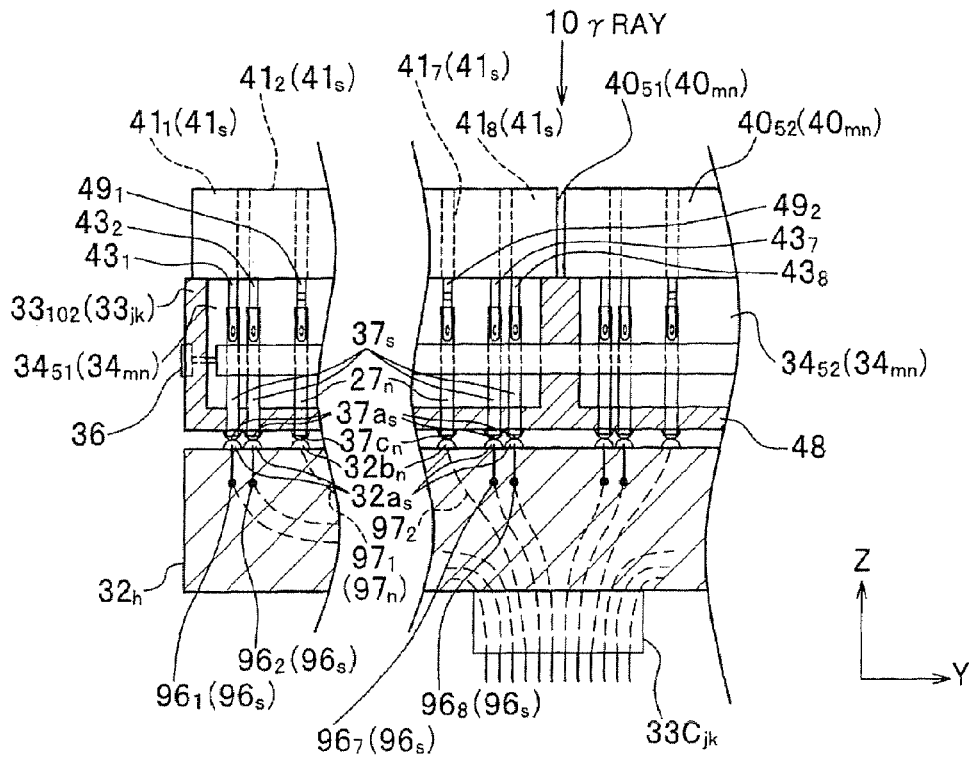
FIG. 7A is a sectional view partly showing a cross section of the connecting device shown in FIG. 6, the cross section being taken along line A-A.
Figure 7B:
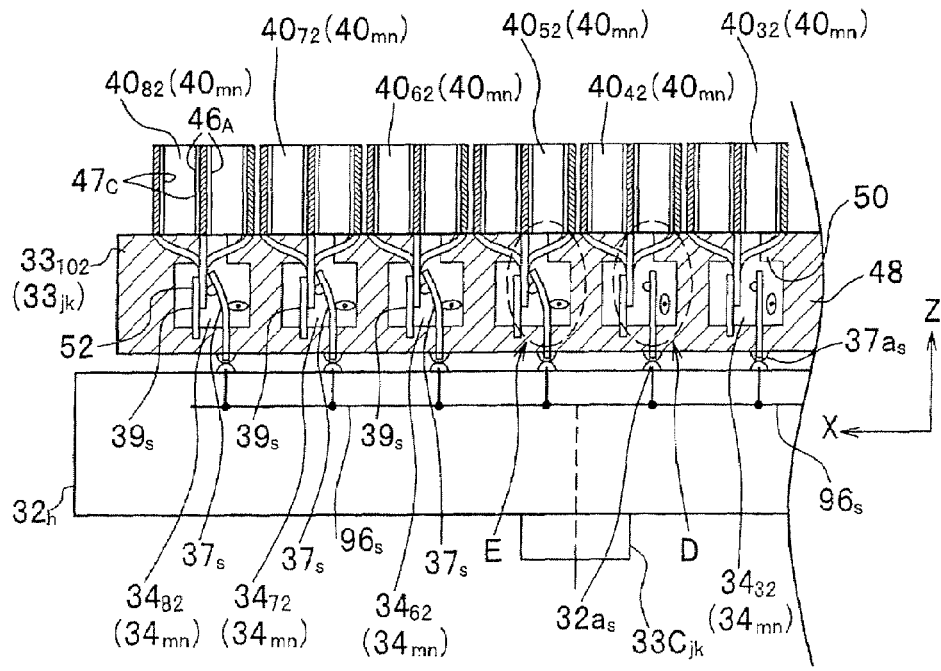
FIG. 7B is a sectional view of the connecting device taken along line B-B in FIG. 6.

As shown in FIGS. 7A and 7B, the conductive pressure contact member $37_s$ is placed in the terminal insertion hole $34_{mn}$ to elastically press the first terminal $43_s$ to hold the detector aggregate $40_{mn}$ and to lead the γ ray detection signal generated by the detection of γ ray 10 to the daughter board $32_h$. The conductive pressure contact member $27_n$ is also placed in the terminal insertion hole $34_{mn}$ to elastically press the second terminal $42_n$ to hold the detector aggregate $40_{mn}$ and to lead the γ ray detection signal to the daughter board $32_h$. The contact members $29_n$ and $39_s$ and rotation operating member 36 are also arranged in the terminal insertion hole $34_{mn}$.

Pads $37a_s$ and $37c_n$ are provided on the connecting device $33_{jk}$; the pad $37a_s$ is formed at the terminal of the pressure contact member $37_s$ and pad $37c_n$ is formed at the terminal of the pressure contact member $27_n$. Pads $32a_s$ and $32b_n$ are provided on the daughter board $32_h$. The pad $37a_s$ is connected, in a BGA (Ball Grid Array) manner, to a pad $32a_s$ connected to a wire $96_s$ located inside the daughter board $32_h$. The γ ray detection signal led to the wire $96_s$ via the pressure contact member $37_s$ is output to the mother board 31 through the output terminal $33c_{jk}$. The BGA connection is a solder connection based on a reflow process. The pad $37c_n$ is connected, in the BGA manner, to a pad $32b_n$ connected to a wire $97_n$ inside the daughter board $32_h$. The γ ray detection signal led to a wire $97_n$ via the pressure contact member $27_n$ is output to the mother board 31 through the output terminal $33c_{jk}$.

The pad $37a_s$ may be formed at the terminal of the contact member $39_s$ rather than at the terminal of the pressure contact member $37_s$ by extending the contact member $39_s$ to the bottom surface of the housing 48. Similarly, the pad $37c_n$ may be formed at the terminal of the contact member $29_n$ rather than at the terminal of the pressure contact member $27_n$ by extending the contact member $29_n$ to the bottom surface of the housing 48.

Figure 8A:
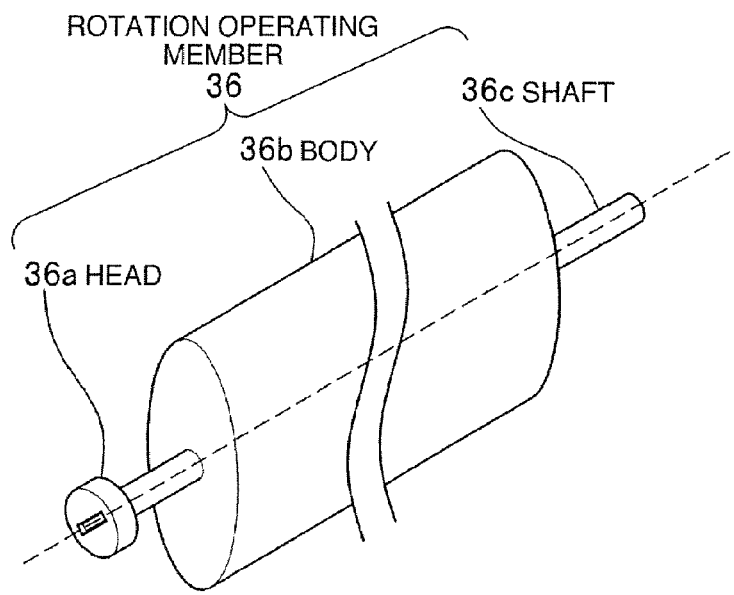

As shown in FIG. 8A, the rotation operating member 36 has a head $36a$ in which the tip of a removal tool 47 (see FIG. 6) such as a driver is fitted, a body portion $36b$ with an elliptical cross section, and a shaft $36c$ rotatably supported by the connecting device $33_{jk}$ (see FIG. 4). One rotation operating member 36 is provided for each terminal insertion hole $34_{mn}$ (see FIG. 6). As shown in FIG. 7A, the rotation operating member 36 is rotatably supported by the housing 48 so that its longitudinal direction coincides with the longitudinal direction of the detector aggregate $40_{mn}$. The rotation operating member 36, together with the pressure contact member $37_s$, elastically presses a side surface of the first terminal $43_s$ inserted into the terminal insertion hole $34_{mn}$ toward the contact member $39_s$. The rotation operating member 36, the pressure contact member $37_s$, and the contact member $39_s$ form the detector holding member 38 (see FIG. 8B) holding the detector aggregate $40_{mn}$ across the first terminal $43_s$. Further, the rotation operating member 36, together with the pressure contact member $27_n$, elastically presses a side surface of the second terminal $49_n$ inserted into the terminal insertion hole $34_{mn}$ toward the contact member $29_n$. The rotation operating member 36, the pressure contact member $27_n$, and the contact member $29_n$ form the detector holding member 28 (see FIG. 8D) holding the detector aggregate $40_{mn}$ across the second terminal $49_n$.

Figure 8B:
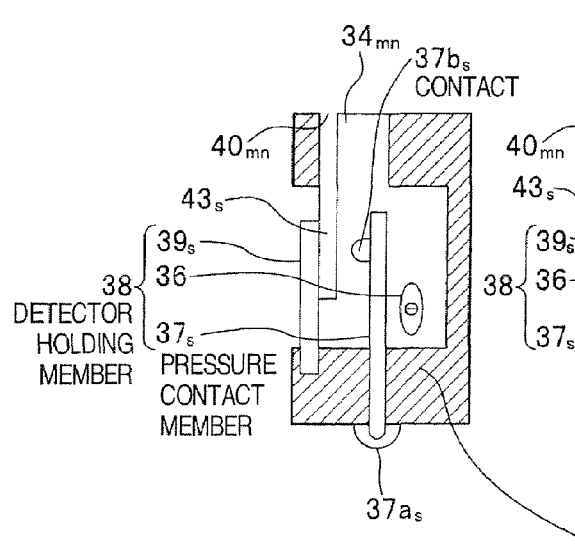
Figure 8C:
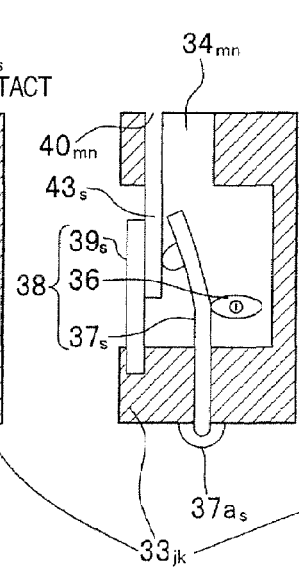
Figure 8D:
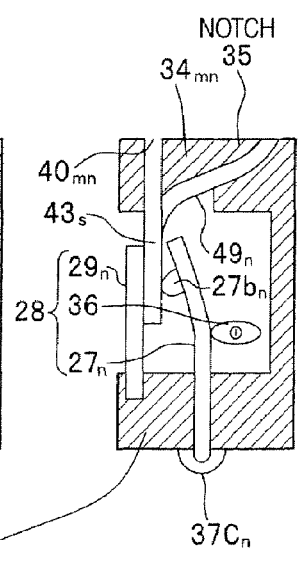

As shown in FIGS. 8B and 8C, the pressure contact member $37s$ constitutes an elastically flexibly deformed cantilever. The pressure contact member $37_s$ has a projection-like contact $37b_s$ at its free end so that it can mechanically and electrically contact the first terminal $43_s$. A projection-like contact $27b_n$ is also provided at the tip of the pressure contact member $27_n$.

With reference to FIGS. 6 and 8B, 8C, and 8D, description will be given of attachment of the detector aggregate $40_{mn}$ to the detector holding members 38 and 28. Description will be given of installation of detector aggregates $40_{81}$ and $40_{82}$ in empty terminal insertion holes $34_{81}$ and $34_{82}$ as shown in FIGS. 4A to 4C. First, the removal tool 47 is used to rotatively move the rotation operating member 36 so that the longitudinal direction of cross section of the rotation operating member 36 coincides with the direction of the Z axis (see FIG. 8B). With the longitudinal direction of cross section of the rotation operating member 36 coinciding with the direction of the Z axis, the pressure contact member $37_s$ of the detector holding member 38 does not contact the body portion $36b$ of the rotation operating member 36. The width of a gap formed between the pressure contact member $37_s$ and the contact member $39_s$ is equal to or larger than the thickness of the first terminal $43_s$ (the same as the thickness of the second terminal $49n$). The width of a gap formed between the pressure contact member $27_n$ and the contact member $29_n$ is also equal to or larger than the thickness of the first terminal $43_s$. Then, the first terminals $43_s$ and second terminals $49_n$ of the two detector aggregates $40_{81}$ and $40_{82}$ are simultaneously inserted into the openings of the terminal insertion holes $34_{81}$ and $34_{82}$. Each first terminal $43_s$ is inserted between the corresponding pressure contact member $37_s$ and contact member $39_s$. Each second terminal $49_n$ is inserted between the corresponding pressure contact member $27_n$ and contact member $29_n$. When the longitudinal direction of cross section of the rotation operating member 36 is parallel to the first terminals (or second terminals), each terminal can be inserted between the pressure contact member and the contact member without sliding the side surface of the terminal on the pressure contact member or contact member. Thus, each terminal is inserted between the pressure contact member and the contact member without any insertion force.

Then, the head $36a$ (see FIG. 8A) of the rotation operating member 36 is rotated using the removal tool 47 through 90°. The longitudinal direction of cross section of the rotation operating member 3 is then orthogonal to the first terminals (or second terminals). The state in which the longitudinal direction of cross section of the rotation operating member 3 is orthogonal to the first terminals (or second terminals) includes the state in which the longitudinal direction is orthogonal to extensions of the first terminals (or second terminals). With the longitudinal direction of cross section of the rotation operating member 3 orthogonal to the first terminals, an outer surface of the body portion $36b$ contacts a side surface of the pressure contact member $37_s$ to press the pressure contact member $37_s$ toward the contact member $39_s$. The pressure contact member $37_s$ is flexibly deformed (see FIG. 8C). The contact $37b_s$ contacts a side surface of the first terminal $43_s$ positioned between the pressure contact member $37_s$ and the contact member $39_s$. This makes the first terminal $43_s$ and the pad $37a_s$ electrically conductive to enable an analog signal provided by the detector aggregate $40_{mn}$ to be output through the pad $37a_s$. The contact $27b_n$ contacts the second terminal $49_n$ positioned between the pressure contact member $27_n$ and the contact member $29_n$ to make the second terminal $49_n$ and the pad $37c_n$ electrically conductive. The first terminal $43_s$ and the second terminal $49_n$ are pressed against the contact members $39_s$ and $29_n$ by the flexibly deformed pressure contact members $37_s$ and $27_n$. Thus, each detector 1 is attached to the zero insertion force connector 56 to mount the detector aggregates $40_{81}$ and $40_{82}$ on the connecting device $33_{jk}$. That is, the detector aggregates $40_{81}$ and $40_{82}$ are mounted on the daughter board $32_h$. The other detector aggregates $40_{mn}$ are similarly mounted on the connecting device $33_{jk}$. Owing to their high rigidity, the contact members $29_n$ and $39_s$ are not deformed even under the pressure of the pressure contact member.

With the detector aggregate $40_{mn}$ attached to the zero insertion force connector 56, the anode $46_A$, conductive member $41_s$, cathode $47_c$, and conductive member $42_n$ of the detector aggregate $40_{mn}$ are arranged perpendicularly to the daughter board $32_h$. With all the detector aggregates $40_{mn}$ attached to the respective zero insertion force connectors 56 of the connecting device $33_{jk}$, the plurality of detectors 1 are arranged in a certain direction (for example, the X axis direction). A plurality of the detectors 1 are arranged in a different direction (for example, the Y axis direction) orthogonal to the above direction.

To remove the detector aggregate $40_{mn}$ ($40_{81}$ and $40_{82}$) from the connecting device $33_{jk}$, the rotation operating member 36 is further rotated through 90° using the removal tool 47. Then, as shown in FIG. 8B, the pressure member $37_s$ leaves the pressure contact member $37_s$ to cancel the pressure of the contact $37b$, on the first terminal $43_s$. The pressure on the second terminal $49n$ is also cancelled. Thus, the detector 1, that is, the detector aggregate $40_{mn}$ ($40_{81}$, $40_{82}$) can be removed from the connecting device $33_{jk}$, that is, the zero insertion force connector 52 without exerting a frictional force.

In the present embodiment, no thermal process (solder reflow or the like) is required in mounting the detector 1 on the daughter board $32_h$. This enables the use of detectors 1 having characteristics impaired by heating history. The present embodiment is also significantly advantageous in that if detectors 1 are used which are not substantially affected by a single thermal process, a thermal process required to replace some defective detectors 1 does not fatigue surrounding detectors 1 even with heat cycles.

The first terminal $43_s$ of the detector aggregate $40_{mn}$ is inserted between the pressure contact member $37_s$ and the contact member $39_s$, which are open. The second terminal $42_n$ of the detector aggregate $40_{mn}$ is inserted between the pressure contact member $27_n$ and the contact member $29_n$, which are open. Then, the detector aggregate $40_{mn}$ can be held on the detector support member 50. Accordingly, rotation of the rotation operating member 36 enables the detector aggregate $40_{mn}$ to be easily attached to the zero insertion force connector 52. Naturally, the gap between the pressure contact member $37_s$ and the contact member $39_s$, which are open, is located immediately below the corresponding opening formed in the detector support member 50. The gap between the pressure contact member $27_n$ and the contact member $29_n$, which are open, is located immediately below the corresponding opening formed in the detector support member 50. Without the detector support member 50, the detector aggregate $40_{mn}$ must be gripped using a certain method until the detector aggregate $40_{mn}$ is attached to the zero insertion force connector 52 by rotating the rotation operating member 36.

In the above description, the detector holding member 38 allows the pressure contact member $37_s$ and the rotation operating member 36 to cooperate in holding the detector aggregate $40_{mn}$. However, the connecting device $33_{jk}$ is not limited to such a configuration. Any structure can be used provided that it enables the detector 1 to be installed and removed without any insertion force (with zero frictional force).

Now, with reference to FIG. 9, description will be given of a structure for connecting the anodes 3 and cathodes 4 of a plurality of detectors $1a$ arranged in a tetragonal lattice. The detector $1a$ has the anode 3 and the cathode 4 on two surfaces of the semiconductor base material 44A so that the semiconductor base material 44A is sandwiched between the anode 3 and the cathode 4. The anode 3 and the cathode 4 are conductive metal plates. In each arrangement including the plurality of detectors $1a$ arranged in the X axis direction, each of the anodes 3 is connected to a wire 12 extending in the X axis direction. In each arrangement including the plurality of detectors 1 arranged in the Y axis direction, each of the cathodes 4 is connected to a wire 14 extending in the Y axis direction.

In this manner, in the plurality of detectors 1 arranged like a plane, the plurality of detectors 1 connected together in one direction have their anodes 3 electrically connected together using one wire 12. Further, the plurality of detectors 1 connected together in a direction orthogonal to the above direction have their cathodes 4 electrically connected together using one wire 14. This wiring structure is called a matrix structure.

A γ ray is incident on one of the detectors 1, specifically the semiconductor base material 44, to generate charges through interaction. Then, information (γ ray detection signal) on the charges is obtained through the wires 12 and 14 connected to the detector 1. Simultaneity determination enables the identification of the wires 12 and 14 having simultaneously obtained the information on the charges. This makes it possible to determine that the γ ray has entered the detector 1 connected to the identified wires 12 and 14.

Now, with reference to FIGS. 7A and 7B, description will be given of a wire matrix structure in accordance with the present embodiment. In the present embodiment, wires $96_s$ and $97_n$ are provided in the daughter board $32_h$ for each connector device $33_{jk}$; the wire $96_s$ extends in the X axis direction, the wire $97_n$ extends in the Y axis direction, the wires $96_s$ and $97_n$ constitute the wire matrix structure shown in FIG. 9. In 16 detector aggregates $40_{mn}$ mounted on one connecting device $33_{jk}$, the common wire $96_s$ electrically connects to the first terminals $43_s$ (for example, the first terminals $43_1$) of the detector aggregates $40_{m1}$ adjacent to each other in the X axis direction as shown in FIGS. 7A and 7B. Separate wires $96_s$ connect to the first terminals $43_2$, $43_3$, and the like of the detector aggregates $40_{m1}$ adjacent to each other in the X axis direction. Further, the common wire $97_1$ connects the second terminals $49_1$ of the two detector aggregates $40_{51}$ and $40_{52}$, which are arranged in the Y axis direction. The common wire $97_2$ connects the second terminals $49_2$ of the detector aggregates $40_{51}$ and $40_{52}$. Likewise, the common wire $97_n$ connects the second terminals $49_n$ of the two other detector aggregates $40_{mn}$ arranged in the Y axis direction.

The wires 96s and 97n are connected to the measuring circuit unit 8 via the mother board 31. The measuring circuit unit 8 has a signal processing device (not shown) for each connecting device $33_{jk}$. The signal processing device carries out a simultaneity determination on for one connecting device $33_{jk}$ on the basis of charge information input to the wires $96_s$ and 97n. The measuring circuit unit 8 thus identify the wires 96s and 97n having simultaneously obtained the charge information. The detector 1 connected to the identified wires $96_s$ and 97n has detected the γ ray 10. The signal processing device thus recognizes the position of the detector 1 having detected the γ ray 10.

The data collecting and analyzing device 23 creates tomography information on the patient P on the bases of the positional data on the detector 1 having detected the γ ray, the data having output by the corresponding signal processing device in the measuring circuit unit 8.

The present embodiment has the above wire matrix structure. Consequently, if for example, n×n detectors 1 are provided, the number of signal read channels connected to the detector 1 is sharply reduced to 2n. This makes it possible to reduce the size of detector pixels and to arrange the signal read channels behind the detector aggregate $40_{mn}$. Further, the reduction in the number of signal read channels contributes to miniaturization of the semiconductor radiation detecting device 30.

Furthermore, a capacitive element (not shown) and a resistive element (not shown) using for wiring of the matrix structure are installed on the back surface of the daughter board (first support substrate) $32_h$ and between the output terminals $33_{Cjk}$ (or on the front surface of the mother board and between the input terminals $33_{Cjk}$); the capacitive element is positioned between the detector 1 and the measuring circuit unit 8 and connected to them, and the resistive element is positioned between the detector 1 and the high voltage power source and connected to them.

The above present embodiment can exert the advantages described below.

In the present embodiment, the terminals (first terminal $43_s$ and second terminal $49_n$) connected to each electrode of the detector 1 can be detachably attached to the zero insertion force connector 52. The zero insertion force connector 52 enables the detector aggregate $40_{mn}$, that is, the detector 1, to be easily replaced with a new one. The detector 1, that is, the detector aggregate $40_{mn}$ that becomes defective in use is desirably replaced with a new one. By rotating the rotation operating member 36 to widen the gap between the pressure contact member and contact member of the zero insertion force connector 52 as shown in FIG. 8B, it is possible to easily pull the detector aggregate $40_{mn}$ out of the zero insertion force connector 52 using, for example, vacuum tweezers. A new detector aggregate $40_{mn}$ can also be easily attached to the connector 52. The replacement of the detector aggregate $40_{mn}$ may be carried out with the daughter board $32_h$ removed from the mother board 31.

According to the present embodiment, in FIG. 8B, when each terminal of the detector aggregate $40_{mn}$ is inserted between the pressure contact member and contact member of the zero insertion force connector 52 using the vacuum tweezers, no frictional force is exerted between the terminal and the pressure contact member and contact member. That is, in inserting the detector 1 into the zero insertion force connector 52, it is unnecessary to exert a force for pushing the detector 1 in the connector. Further, no frictional force is exerted when each terminal of the detector aggregate $40_{mn}$ is pulled out of the zero insertion force connector 52. Thus, when each terminal is inserted into and pulled out of the zero insertion force connector 52, the detector aggregate $40_{mn}$ does not incline. This prevents the detector aggregate $40_{mn}$ from contacting the end surface (that is not covered with the conductive member $42_n$) of the semiconductor base material 44 of the adjacent detector aggregate $40_{mn}$. It is thus possible to prevent damage to the semiconductor base material 44 of the adjacent detector aggregate $40_{mn}$, which has a low mechanical intensity. As described above, the detector aggregate $40_{mn}$ does not incline when the terminal is inserted or pulled out. Accordingly, the clearance between the adjacent detector aggregates $40_{mn}$ can be reduced taking electric insulation into account. The detector aggregates 40mn, that is, the detectors 1, can be more densely arranged while preventing damage to the semiconductor base materials 44. This makes it possible to further improve the sensitivity and spatial resolution of the detector 1. The improvement of the detector sensitivity leads to a further reduction in the time required for checks. In the present embodiment, the application of the zero insertion force connector enables the detectors 1 to be densely arranged while allowing each detector aggregate $40_{mn}$ to be replaced with a new one.

Further, the detector 1 can be connected to the daughter board $32_h$ without any thermal process such as soldering. Consequently, the detectors 1, which are not resistant to high temperature, can be densely mounted.

In the present embodiment, the first terminal $43_s$ and second terminal $49_n$ included in the two sub-aggregates 45A and 45B are attached to the zero insertion force connector 52. This reduces the number of zero insertion force connectors 52 required, thus simplifying the structure of the semiconductor radiation detecting device 30.

The first terminal $43_s$ and second terminal $49_n$ of each of the plurality of detector aggregates $40_{mn}$ are attached to one zero insertion force connector 52; the detector aggregates $40_{mn}$ are arranged in series in a certain direction (the longitudinal direction of the rotation operating member 36 or the longitudinal direction of the semiconductor base material 44). This further reduces the number of zero insertion force connectors 52 required, thus further simplifying the structure of the semiconductor radiation detecting device 30.

According to the present embodiment, when the rotation operating member 36 is rotated, that is, operated, the detector aggregate $40_{mn}$ can be held on the detector support member 50. This allows the detector aggregate $40_{mn}$ to be easily attached to the zero insertion force connector 52.

In the present embodiment, the head 36a, which is used for rotate the rotation operating member 36, is exposed from one end surface of the daughter board $32_h$, that is, one surface of the housing 48. Thus, to perform an operation of rotating the rotation operating member 36, the head 36a can be easily accessed by the removal tool 47.

In the present embodiment, the anode $46_A$ and cathode $47_c$ of the detector 1 are arranged perpendicularly to the daughter board $32_h$. Accordingly, compared to a horizontal arrangement with respect to the daughter board $32_h$, the perpendicular arrangement enables the detectors 1 to be densely located. This is because the perpendicular arrangement enables a reduction in the size of the gap between the adjacent detector aggregates $40_{mn}$ which gap is required to arrange conductive members such as wires for connecting electrode films to wires provided in the support substrate.

Further, the conductive member $41_s$ is used to connect the cathodes $47_s$ of the two detectors 1 together, while the conductive member $41_s$ is used to connect together the anodes $46_s$ of the eight detectors 1 arranged in a row. The wire matrix structure is thus employed in the initial stage of wiring. This enables easy connecting operations. It is thus possible to quickly complete the wiring of the matrix structure in the daughter board $32_h$, which is connected to the pads $37Aa_s$ and $37c_n$ of the zero insertion force connector 52.

In the present embodiment, the first terminal $43_s$ and second terminal 49n (see FIG. 3) of each of the detector aggregates $40_{m1}$ and $40_{m2}$ are attached to one set of the pressure contact member and contact member positioned close to one operating member 36; the detector aggregates $40_{m1}$ and $40_{m2}$ are arranged in series in the Y axis direction. However, the first terminal $43_S$ of each of the detector aggregates $40_{m1}$ and $40_{m2}$ may be attached to a first set of the pressure contact member and contact member positioned close to one operating member 36. The second terminal $49_n$ of each of the detector aggregates $40_{m1}$ and $40_{m2}$ may be attached to a second set of the pressure contact member and contact member positioned close to another operating member 36. The first and second sets are arranged in parallel. The pressure contact member and contact member of each set are installed in the bottom portion of the housing 48.

In the present embodiment, the detectors 1A, 1B, 1C, 1D, 1E, 1F, 1G, and 1H share the one elongate semiconductor base material 44. However, each of the detectors may comprise one semiconductor base material. In this case, the detectors 1A, 1B, 1C, 1D, 1E, 1F, 1G, and 1H are separated from one another. However, the detectors 1 are integrated by the conductive member 42.

In the present embodiment, as shown in FIG. 3, in the detector aggregate $40_{mn}$, the detectors 1A, 1B, 1C, 1D, 1E, 1F, 1G, and 1H share one elongate semiconductor base material 33. However, each of the detectors 1A, 1B, 1C, 1D, 1E, 1F, 1G, and 1H may comprise one semiconductor base material. In this case, the detectors 1A, 1B, 1C, 1D, 1E, 1F, 1G, and 1H are separated from one another but are integrated together by the conductive member 42, attached to the cathode $47_c$. The anodes $46_A$ of the two sub-aggregates are connected together by the conductive member $41_s$.

The above technical concept is applicable to the plurality of detectors 1a arranged in the X axis direction as shown in FIG. 9. This arrangement should also be included in the scope of the present invention. The anode 3 shown in FIG. 9 is provided with a first terminal (not shown). The cathode 4 is provided with a second terminal (not shown). The above paired pressure contact member $37_s$ and contact member $39_s$ and paired pressure contact member $27_n$ and contact member $29_n$ are arranged in the X axis direction. The first and second terminals of a plurality of detectors 1a arranged in the X axis direction are inserted between the pressure contact member and the contact member. Then, the rotation operating member 36 is rotated. This enables the first and second terminals of each detector 1a to be attached to zero insertion force connector 52 without any insertion force. The detector 1a can be mounted on the support substrate.

In FIG. 9, a plurality of the detectors 1a arranged in the X axis direction may have their cathodes 4 integrated, with one second terminal attached to the integrated cathodes. In this case, a plurality of the first terminals and one second terminal of the plurality of detectors 1a are attached to the one zero insertion force connector 52.

In the description of the present embodiment, the detectors are applied to the SPECT apparatus (Single Photon Emission CT apparatus) by way of example. However, the present invention is not limited to this. For example, the detectors may be applied to a PET (Positron Emission Tomography apparatus).

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A radiological imaging apparatus, comprising:
  a plurality of semiconductor radiation detectors each having a semiconductor member, a first electrode attached to one surface of said semiconductor member, and a second electrode attached to the other surface of said semiconductor member so as to sandwich said semiconductor member between said first electrode and said second electrode;
  a support substrate; and
  a plurality of zero insertion force connectors attached to said support substrate,
  wherein said first electrode includes a first terminal projecting from said semiconductor member, and said second electrode includes a second terminal projecting from said semiconductor member, and said second terminal includes a bended portion, and
  wherein a plurality of said first and second terminals are arranged in an array, and tip portions of said second terminals coincide with said array of a plurality of said first terminals, and
  wherein a plurality of said zero insertion force connectors are arranged in parallel on said support substrate, and
  wherein in said array, said first terminals and said second terminals are detachably attached to said zero insertion force connectors, and wherein said first electrode is connected to at least one of first wires provided in said support substrate via said zero insertion force connector, and said second electrode is connected to at least one of second wires provided in said support substrate via said zero insertion force connector.

2. A radiological imaging apparatus according to claim 1, wherein said second electrodes of a plurality of said semiconductor radiation detectors are integrated in a unit body.

3. A radiological imaging apparatus according to claim 2, wherein each of said zero insertion force connectors has plural pairs of first contact members between which said first terminal is inserted, a pair of second contact members between which said second terminal is inserted, and an operation member, and when said operation member is in a first state, a pair of said first contact members contact said first terminal and said pair of second contact members contact said second terminal, and when said operation member is in a second state that is different from said first state, said first contact members are out of contact with said first terminal and said second contact members are out of contact with said second terminal.

4. A radiological imaging apparatus according to claim 3, wherein said operation member is a rotation operating member rotatably attached to an operation member support section of a connecting device installed on said support substrate and including a plurality of said zero insertion force connectors.

5. A radiological imaging apparatus according to claim 4, wherein operation ends of said rotation operating members of a plurality of said zero insertion force connectors, which are used to rotate said rotation operating members, are exposed from a front surface of said operation member support section at one end surface of said support substrate.

6. A radiological imaging apparatus according to claim 1, further comprising a plurality of first conductive members attached to said respective first electrodes of a plurality of said semiconductor radiation detectors, and at least one of second conductive members attached to said respective second electrodes of said semiconductor radiation detectors to electrically connect said second electrodes together, wherein said first conductive members include said first terminals, and said second conductive member include said second terminals.

7. A radiological imaging apparatus according to claim 1, wherein each of said semiconductor radiation detectors is held by a detector support member placed between each of said zero insertion force connectors and each of said semiconductor radiation detectors.

8. A radiological imaging apparatus according to claim 7, wherein said detector support member has a cutout to avoid said bended portion of said second terminal attached to each of said zero insertion force connectors.

9. A radiological imaging apparatus according to claim 1, wherein said first wires and said second wires are arranged in a matrix on said support substrate.

10. A radiological imaging apparatus according to claim 1, further comprising a rotation operating member installed on said support substrate and rotatably attached to an operation member support section of a connecting device including a plurality of said zero insertion force connectors, said rotation operating member making said first electrodes and said first wires electrically conductive and making said second electrodes and said second wires electrically conductive.

11. A radiological imaging apparatus according to claim 1, further comprising an operation member installed on said support substrate and attached to an operation member support section of a connecting device including a plurality of said zero insertion force connectors, said operation member making said first electrodes and said first wires electrically conductive and making said second electrodes and said second wires electrically conductive, wherein an operation end of said operation member is exposed from a front surface of said operation member support section at one end surface of said support substrate.

12. A radiological imaging apparatus according to claim 1, further comprising a plurality of detector aggregates each having two sub-aggregates, wherein each of said sub-aggregates has a plurality of semiconductor radiation detectors arranged in a certain direction and each of said semiconductor radiation detectors having said semiconductor member, said first electrode attached to one surface of said semiconductor member, and said second electrode attached to the other surface of said semiconductor member so as to sandwich said semiconductor member between said first electrode and said second electrode, and at least one of second conductive members that electrically connect said second electrodes of a plurality of said semiconductor radiation detectors, each of said detector aggregates has:

a plurality of first conductive members that arrange a plurality of said semiconductor radiation detectors included in one of said sub-aggregates and a plurality of said semiconductor radiation detectors included in the other sub-aggregate so that said first electrodes of said semiconductor radiation detectors lie opposite each other, said first conductive members electrically and separately connecting said opposite first electrodes together.

13. A radiological imaging apparatus comprising:

a plurality of semiconductor radiation detectors each having a semiconductor member, a first electrode attached to one surface of said semiconductor member, and a second electrode attached to the other surface of said semiconductor member so as to sandwich said semiconductor member between said first electrode and said second electrode;

a support substrate; and a plurality of connectors attached to said support substrate and having terminals to be connected to said electrodes of said semiconductor radiation detectors, said terminals being detachably attached to said connectors, wherein each of said terminals includes a first terminal to be connected to said first electrode and a second terminal to be connected to said second electrode, and wherein said second terminal includes a bended portion, and wherein a plurality of said first and second terminals are arranged in an array, and tip portions of said second terminals coincide with said array of a plurality of said first terminals, and wherein a plurality of said zero insertion force connectors are arranged in parallel on said support substrate, and wherein each of said connectors has a plural pairs of contact members between which each of said terminals is inserted and an operation member, and when said operation member is brought into a first state, said terminal inserted between a pair of said contact members contacts said pair of contact members and is held by said pair of contact members, and when said operation member is brought into a second state, said first and second terminal inserted between a pair of said contact members is brought out of contact with said contact members.

14. A radiological imaging apparatus comprising:
a plurality of semiconductor radiation detectors each having a semiconductor member, a first electrode attached to one surface of said semiconductor member, and a second electrode attached to the other surface of said semiconductor member so as to sandwich said semiconductor member between said first electrode and said second electrode;
a support substrate; and
a plurality of connectors attached to said support substrate and having first terminals to be connected to said first electrodes and second terminals to be connected to said second electrodes, said first and second terminals being detachably attached to said connectors,
wherein said second terminals include bended portions, and tip portions of said second terminals coincide with an array of said first terminals, and
wherein said connectors are arranged in parallel on said support substrate, and
wherein said connectors include plural pairs of first contact members between which said first terminals are inserted and a pair of second contact member between which said second terminal is inserted and an operation member, and
when said operation member is in a first state, a pair of said first contact members is in contact with said first terminal and a pair of said second contact members is in contact with said second terminal, and when said operation member is in a second state that is different from said first state, said first contact members are out of contact with said first terminals and said second contact members are out of contact with said second terminals.

15. A radiological imaging apparatus comprising:
a plurality of semiconductor radiation detectors each having a semiconductor member, a first electrode attached to one surface of said semiconductor member, and a second electrode attached to the other surface of said semiconductor member so as to sandwich said semiconductor member between said first electrode and said second electrode;
a support substrate; and
a plurality of connectors detachably attached to said support substrate and having first terminals to be connected to said first electrodes and second terminals to be connected to said second electrodes, said first and second terminals being detachably attached to said connectors,
wherein said second terminals include bended portions, and tip portions of said second terminals coincide with an array of said first terminals, and
wherein said connectors are arranged in parallel on said support substrate, and
wherein said connectors include plural pairs of contact members between which said first terminals are inserted and a pair of second contact member between which said second terminal is inserted and an operation member, and
when said operation member is in a first state, a pair of said first contact members applies a pressing force to said first terminals and a pair of said second contact members applies a pressing force to said second terminals, and when said operation member is in a second state that is different from said first state, said application of said pressing forces by said first contact members and said second contact members is cancelled.

16. A radiological imaging apparatus according to any one of claims 1, 13, 14 and 15, further comprising a second support substrate on which a plurality of first support substrates of said support substrate are mounted.

17. A nuclear medicine diagnostic apparatus comprising:
a rotation support; and
at least one of radiation detecting devices mounted on said rotation support,
wherein said radiation detecting device comprises:
a support member mounted on said rotation support;
a support substrate installed on said support member;
a plurality of zero insertion force connectors attached to said support substrate and arranged in one direction; and
a plurality of semiconductor radiation detectors detachably attached to said zero insertion force connectors,
wherein each of said plurality of semiconductor radiation detectors has a semiconductor member, a first electrode attached to one surface of said semiconductor member, and a second electrode attached to the other surface of said semiconductor member so as to sandwich said semiconductor member between said first electrode and said second electrode, said semiconductor radiation detectors being arranged to form a plurality of first arrays in said one direction and a plurality of second arrays in a different direction crossing said one direction, and
wherein said semiconductor radiation detectors further comprise a plurality of first conductive members attached to said respective first electrodes of a plurality of said semiconductor radiation detectors included in said second arrays and a plurality of second conductive members attached to said respective second electrodes of said semiconductor radiation detectors to electrically connect said second electrodes together, and
wherein said semiconductor radiation detectors further comprise first terminals included in said respective first conductive members and projecting from said semiconductor members and second terminals included in said second conductive members and projecting from said semiconductor members,
wherein said second terminals include bended portions, and tip portions of said second terminals coincide with an array of said first terminals, and
wherein in said array, said second terminals are detachably attached to said one zero insertion force connector together with said first terminals.

18. A nuclear medicine diagnostic apparatus according to claim 17, wherein a plurality of first wires and a plurality of second wires are installed in said support substrate, a plurality of said first wires each being provided for each of said second arrays and being connected via said zero insertion force connectors to said first terminals of said first conductive members separately attached to said semiconductor radiation detectors in said second arrays, and a plurality of said second wires each being provided for each of said first arrays and being connected via said zero insertion force connectors to said second terminals of said second conductive members attached to said semiconductor radiation detectors in said first arrays.

19. A nuclear medicine diagnostic apparatus comprising:
a rotation support; and
at least one of radiation detecting devices mounted on said rotation support,
wherein said radiation detecting device has a support member mounted on said rotation support, a support substrate installed on said support member, a plurality of zero insertion force connectors attached to said support substrate and arranged in one direction, and detector aggregates each detachably attached to said corresponding one of a plurality of said zero insertion force connectors,
said detector aggregate has a first detector array and a second detector array each extending in a different direction crossing said one direction and including a plurality of semiconductor radiation detectors, wherein each of said plurality of semiconductor radiation detectors comprises:
a semiconductor member;
a first electrode attached to one surface of said semiconductor member; and
a second electrode attached to the other surface of said semiconductor member so as to sandwich said semiconductor member between said first electrode and said second electrode, and
wherein a plurality of said semiconductor radiation detectors included in said first detector array and a plurality of said semiconductor radiation detectors included in said second detector array are arranged so that said first electrodes of said former semiconductor radiation detectors are arranged opposite said first electrodes of said latter semiconductor radiation detectors, said opposite first electrodes being electrically connected together by first conductive members,
wherein each of said second electrodes of a plurality of said semiconductor radiation detectors included in said first detector array is electrically connected to each of said second electrodes of a plurality of said semiconductor radiation detectors included in said second detector array by separate second conductive members,
wherein said semiconductor radiation detectors further comprises first terminals included in said respective first conductive members and projecting from said semiconductor members and second terminals included in said second conductive members and projecting from said semiconductor members, wherein said second terminals include bended portions, and tip portions of said second terminals are arranged so as to coincide with an array of said first terminals, and in said array, said second terminals are detachably attached to said zero insertion force connector together with said first terminals.

20. A nuclear medicine diagnostic apparatus according to claim 19, wherein a plurality of said first detector arrays and a plurality of said second detector arrays are formed in said one direction with a plurality of said semiconductor radiation detectors included in a plurality of said detector aggregates, and a plurality of detector arrays are formed in said different direction with a plurality of said semiconductor radiation detectors included in a plurality of said detector aggregates,
wherein a plurality of first wires, a plurality of second wires, and a plurality of third wires are installed in said support substrate,
wherein said first wires are provided for each of said detector arrays in said different direction, and connected via said zero insertion force connectors to said first terminals of said first conductive members separately attached to each of said semiconductor radiation detectors in said detector arrays, and said second wires are provided for each of said first detector arrays and connected via said zero insertion force connectors to said second terminals of one of said second conductive members attached to said semiconductor radiation detectors in said first detector arrays, said third wires are provided for each of said second detector arrays and connected via said zero insertion force connectors to said second terminals of the other second conductive members attached to said semiconductor radiation detectors in said second detector arrays.

21. A nuclear medicine diagnostic apparatus according to any one of claims 17 and 19, wherein each of said semiconductor radiation detectors is held by a detector support member placed between each of said zero insertion force connectors and each of said semiconductor radiation detectors.

22. A nuclear medicine diagnostic apparatus according to any one of claims 17 and 19, wherein
each of said zero insertion force connectors has plural pairs of first contact members between which said first terminals are inserted, a pair of second contact members between which said second terminals are inserted, and an operation member, and
when said operation member is in a first state, a pair of said first contact members contact said first terminals, and a pair of said second contact members contact said second terminals, and when said operation member is in a second state that is different from said first state, said first contact members are out of contact with said first terminals and said second contact members are out of contact with said second terminals.

23. A nuclear medicine diagnostic apparatus according to claim 22, wherein said paired first contact members and said paired second contact members are arranged in a line in a longitudinal direction of said zero insertion force connectors while maintaining said paired form.

24. A nuclear medicine diagnostic apparatus according to claim 22, wherein said operation member is a rotation operating member rotatably attached to a side wall of a housing which is installed on said support substrate and within which a plurality of said zero insertion force connectors are arranged.

25. A nuclear medicine diagnostic apparatus according to any one of claims 17 and 19, further comprising a second support substrate on which a plurality of first support substrates each of which is said support substrate are mounted.

26. A nuclear medicine diagnostic apparatus according to claim 19, wherein said semiconductor members of a plurality of said semiconductor radiation detectors included in said first detector array are integrated together, and said semiconductor members of a plurality of said semiconductor radiation detectors included in said second detector array are integrated together.

* * * * *